(12) United States Patent
Kawauchi

(10) Patent No.: US 9,107,289 B2
(45) Date of Patent: Aug. 11, 2015

(54) DISPLAY DEVICE

(75) Inventor: Taketo Kawauchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 115 days.

(21) Appl. No.: 14/000,316

(22) PCT Filed: Jan. 18, 2012

(86) PCT No.: PCT/JP2012/000275
§ 371 (c)(1),
(2), (4) Date: Aug. 19, 2013

(87) PCT Pub. No.: WO2012/117657
PCT Pub. Date: Sep. 7, 2012

(65) Prior Publication Data
US 2014/0016287 A1  Jan. 16, 2014

(30) Foreign Application Priority Data

Feb. 28, 2011  (JP) .................................. 2011-041357

(51) Int. Cl.
H05K 5/00 (2006.01)
H05K 9/00 (2006.01)
H01R 13/6584 (2011.01)
G09F 9/00 (2006.01)
(Continued)

(52) U.S. Cl.
CPC ................ *H05K 9/0054* (2013.01); *G09F 9/00* (2013.01); *H01Q 1/526* (2013.01); *H01R 13/6584* (2013.01); *H05K 5/02* (2013.01)

(58) Field of Classification Search
USPC ........... 361/679.01, 679.02, 679.21, 752, 757
See application file for complete search history.

(56) References Cited

U.S. PATENT DOCUMENTS 7,119,479 B2 * 10/2006 Hori et al. ..................... 313/110
2009/0231238 A1    9/2009 Fusayasu et al.

FOREIGN PATENT DOCUMENTS

JP      62-127178 U      8/1987
JP      06-007283 U      1/1994
JP      2004-361913 A   12/2004
(Continued)

OTHER PUBLICATIONS

Tsuchida Yoshiaki, Plasma Display Device, dated Dec. 24, 2004, JP 2004-361913, pp. 1-16, translated on Jan. 11, 2015.*
(Continued)

*Primary Examiner* — Robert J Hoffberg
*Assistant Examiner* — Hung Dang
(74) *Attorney, Agent, or Firm* — McDermott Will & Emery LLP

(57) ABSTRACT

A display device includes a display panel including a display part; a conductive film located on a front surface of the display panel and made of a conductive member; a non-conductive housing frame that is located on a surface of the conductive film opposite to a surface of the conductive film facing the display panel, covers a peripheral part of the display panel, and has at least one through hole penetrating the housing frame along a front-and-back direction; a conductive coupling member disposed in the through hole and electrically coupled to the conductive film; and a conductive decorative panel that covers a surface of the housing frame opposite to a surface of the housing frame facing the conductive film and is electrically coupled to the coupling member.

6 Claims, 4 Drawing Sheets

(51) Int. Cl.
*H05K 5/02* (2006.01)
*H01Q 1/52* (2006.01)

(56) References Cited

FOREIGN PATENT DOCUMENTS

| JP | 2006-146087 A | 6/2006 |
| JP | 2007-194545 A | 8/2007 |
| JP | 2010-010255 A | 1/2010 |

OTHER PUBLICATIONS

International Search Report issued in PCT/JP2012/000275, dated Mar. 6, 2012, with English translation.

* cited by examiner

DISPLAY DEVICE

RELATED APPLICATIONS

This application is the U.S. National Phase under 35 U.S.C. §371 of International Application No. PCT/JP2012/000275, filed on Jan. 18, 2012, which in turn claims the benefit of Japanese Application No. 2011-041357, filed on Feb. 28, 2011, the disclosures of which Applications are incorporated by reference herein.

TECHNICAL FIELD

The present disclosure relates to display devices, and more particularly to a display device using a conductive material as a decorative panel of a housing.

BACKGROUND ART

There has been vigorous competition in design of display devices in recent years. With reduction in thickness and cost of display devices, display devices have become purchased by a wide range of consumers, and accordingly, product differentiation by appearance has become more and more important.

In particular, display devices with design using metal materials for their appearance are popular. Display devices using metals on the surfaces of rim members surrounding display screens, i.e., so-called the bezels, of the display devices have been introduced on the market.

In using metal materials for appearance, unwanted radiation needs to be taken into consideration. This is because display devices with some design might radiate an electromagnetic wave with a frequency out of the design. This problem is called formation of antennas by display devices.

The formation of antennas by display devices, which is a cause of unwanted radiation, will be described in detail. Inner parts of display devices always radiate electromagnetic waves. Electromagnetic waves radiated are typically adjusted within a range where substantially no problems occur in terms of design. This is because an electromagnetic wave can be adjusted to have a frequency and intensity within a design range by appropriately adjusting the shape of a conductive housing. However, when a metal material electrically independent of a display device is disposed near the display device, an electromagnetic wave adjusted within a design range might be radiated by the metal material. That is, the metal material might serve as an antenna.

To prevent unwanted radiation by formation of antennas by display devices, various efforts has been made. For example, Patent Document 1 shows a technique of electrically coupling a metal material to a part in a display device through a machine screw. This configuration can prevent unwanted radiation.

CITATION LIST

Patent Document

PATENT DOCUMENT 1: Japanese Patent Publication No. 2004-361913

SUMMARY OF THE INVENTION

Technical Problem

However, some display devices cannot employ the above-described conventional technique. For example, design of display devices has required further reduction of thickness of the display devices in recent years. In addition, the design of display devices has also required reduction of the number of parts.

To meet these requirements, it is undesirable to dispose two frame bodies on the front screen of a display panel as proposed in the conventional technique. Thus, a technique of disposing a conductive part to be electrically coupled on the front screen of the display panel and bringing the tip of an external machine screw into contact with the screen cannot be employed.

That is, the conventional technique involves a problem in which a display device using metal material for a decorative panel and designed to prevent unwanted radiation shows a decrease in the degree of freedom in internal design.

It is therefore an object of the present disclosure to provide a display device in which unwanted radiation can be reduced even with the use of a metal material for a decorative panel without a decrease in the degree of freedom in internal design.

Solution to the Problem

To achieve the object, according to the present disclosure, a metal decorative panel provided on a surface of a non-conductive housing frame and constituting a display device is electrically coupled to a conductive film provided between a display panel and the housing frame and constituting the display device, via a through hole disposed in the housing frame.

Specifically, a display device according to the present disclosure includes a display panel including a display part; a conductive film located on a front surface of the display panel and made of a conductive member; a non-conductive housing frame that is located on a surface of the conductive film opposite to a surface of the conductive film facing the display panel, covers a peripheral part of the display panel, and has at least one through hole penetrating the housing frame along a front-and-back direction; a conductive coupling member disposed in the through hole and electrically coupled to the conductive film; and a conductive decorative panel that covers a surface of the housing frame opposite to a surface of the housing frame facing the conductive film and is electrically coupled to the coupling member.

Advantages of the Invention

According to the present disclosure, a display device that may not cause unwanted radiation even with the use of a metal material for its decorative panel can be obtained without a decrease in the degree of freedom in internal design.

BRIEF DESCRIPTION OF THE DRAWINGS

FIG. 4A is an overall perspective view, and FIG. 4B is a partial cross-sectional view taken along line IVb-IVb in FIG. 4A.

DESCRIPTION OF EMBODIMENTS (Embodiment)

A display device according to an embodiment of the present disclosure will be described with reference to FIGS. 1-3, 4A, and 4B.

<Device Configuration>

Figure 1:
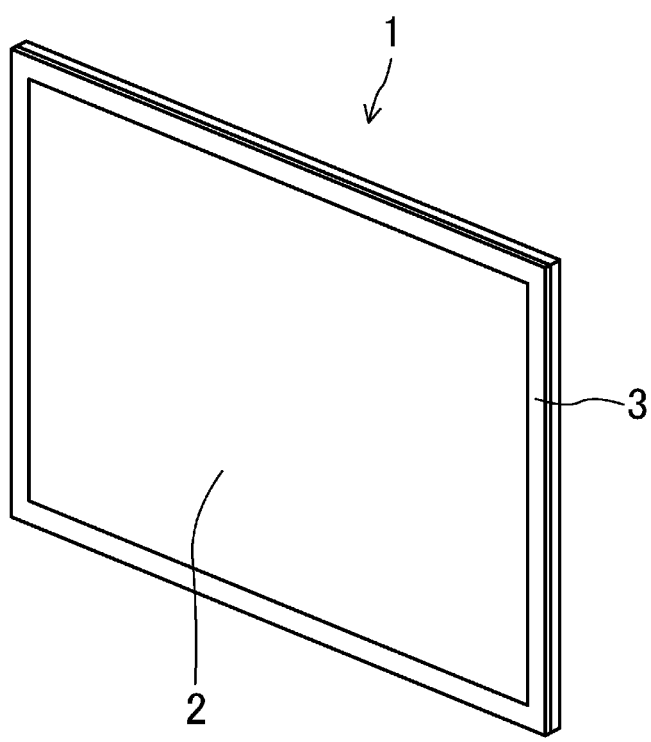
FIG. 1 is a perspective view illustrating a display device according to an embodiment of the present disclosure.

First, an appearance of the display device will be described with reference to FIG. 1. As illustrated in FIG. 1, when viewed from the front surface of a display device 1, a display part 2 where an image is displayed and a decorative panel 3 are observed.

Figure 2:
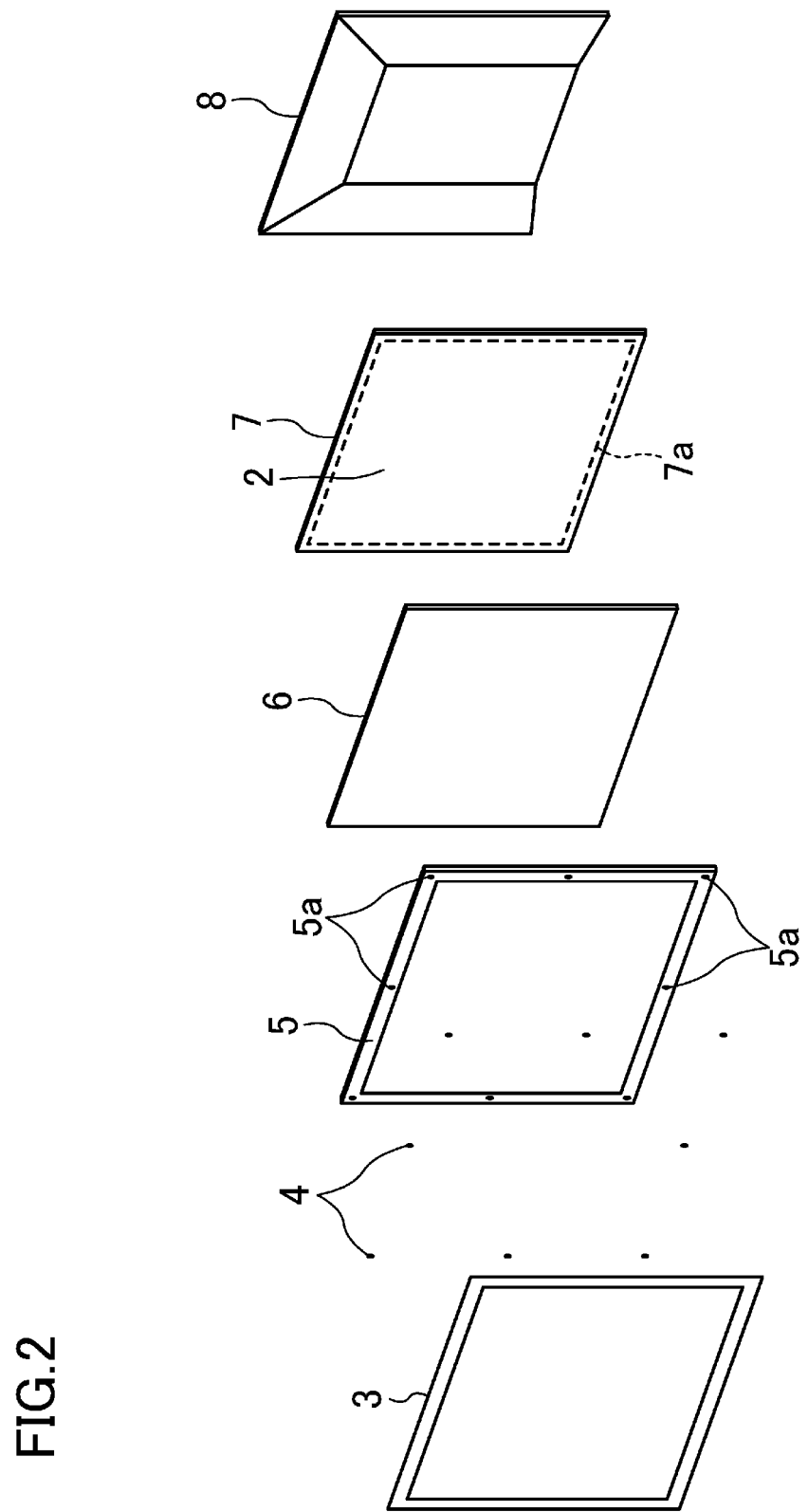
FIG. 2 is a disassembled perspective view illustrating the display device of the embodiment.

Next, the inner configuration of the display device 1 will be described with reference to FIG. 2. The display device 1 includes a decorative panel 3, a plurality of coupling members 4, a housing frame 5, a conductive film 6, a display panel 7, and a back cover 8 that are arranged in this order from the front of the display device 1.

Components of the display device 1 will now be individually described. The display device 1 includes a large number of other components that are not shown in the drawings for simplicity of description.

The decorative panel 3 is a frame body of a metal such as aluminium (Al). The decorative panel 3 having a metallic luster is disposed on the front surface of the housing frame 5 as described above, thereby providing a quality appearance when viewed from the outside.

The coupling members 4 are gaskets each formed by winding a conductive material on a sponge member. Thus, the coupling members 4 of this embodiment can be elastically deformed. The multiple coupling members 4 are provided at the back surface of the decorative panel 3, and electrically couple the decorative panel 3 to the conductive film 6.

The housing frame 5 is a non-conductive frame body. The front size of the housing frame 5 is identical to that of the decorative panel 3, and thus, the housing frame 5 cannot be seen from the front. The side surfaces of the housing frame 5 constitute the side surfaces of the display device 1. The housing frame 5 is made of conductive aluminium, but the surface thereof has been subjected to an oxidation process. This oxidation process has formed an oxide film (an aluminium oxide film) on the surface of the housing frame 5. Since the oxide film is not conductive, the housing frame 5 is not conductive in the surface thereof. The housing frame 5 has through holes 5a at locations respectively corresponding to the coupling members 4. The coupling members 4 are respectively placed in the through holes 5a. The housing frame 5 is bonded to the conductive film 6 by a double-sided adhesive tape.

The conductive film 6 has a mesh structure in which a fibrous member is disposed to have a mesh pattern in a transparent film of glass or a resin material. The conductive film 6 covers the surface (the front surface) of the display panel 7, and is electrically connected to the decorative panel 3 via the coupling members 4. The conductive film 6 is electrically connected to, for example, ground of the display device 1. That is, the potential of the conductive film 6 is equal to the reference potential of an electrical circuit that drives the display device 1. The conductive film 6 is a film having a reference potential and serves as an electromagnetic shield. An electromagnetic wave is emitted from the surface of the display panel 7, and the conductive film 6 reduces the amount of the electromagnetic wave irradiated outward from the display device 1.

The display panel 7 includes the display part 2 where an image is displayed and a peripheral part 7a located at the periphery of the display part 2 and covered with the housing frame 5. In FIG. 2, the boundary between the display part 2 and the peripheral part 7a is indicated by a broken line.

The back cover 8 is made of, for example, a resin material, and covers the back surface of the display panel 7.

Figure 3:
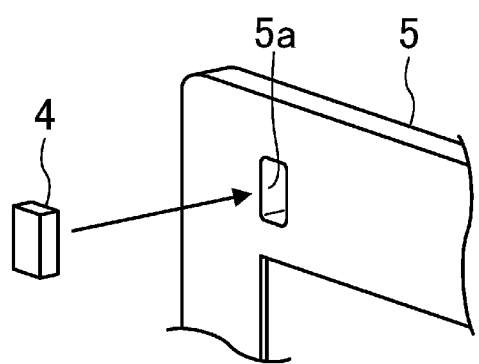
FIG. 3 is a partially enlarged perspective view illustrating the display device of the embodiment.

FIG. 3 illustrates a configuration in which the coupling members 4 are disposed in the through holes 5a of the housing frame 5. FIG. 3 partially illustrates a corner of the display device 1 of this embodiment in an enlarged manner.

The coupling members 4 are inserted in the through holes 5a of the housing frame 5. This configuration allows each of the coupling members 4 to be electrically connected to the conductive film 6 (not shown) at the front thereof at one end and also electrically connected to the decorative panel 3 (not shown) at the front thereof at the other end. The insides of the coupling members 4 are not limited to the sponge member. However, the insides of the coupling members 4 are preferably made of a member that can be elastically deformed so as to absorb variations in dimensions such as height and width of the through holes 5a. The coupling members 4 made of a sponge member is advantageous in having a small repulsing force applied to the decorative panel 3 and the conductive film 6 upon elastic deformation of the coupling members 4.

In this embodiment, eight coupling members 4 are provided in the housing frame 5, but the number of the coupling members 4 is not limited to eight. Any number of the coupling members 4 may be provided as long as the intensity of an electromagnetic wave radiated from the conductive decorative panel 3 is lower than a predetermined value.

<Function and Advantages of Display Device>

Figure 4A:
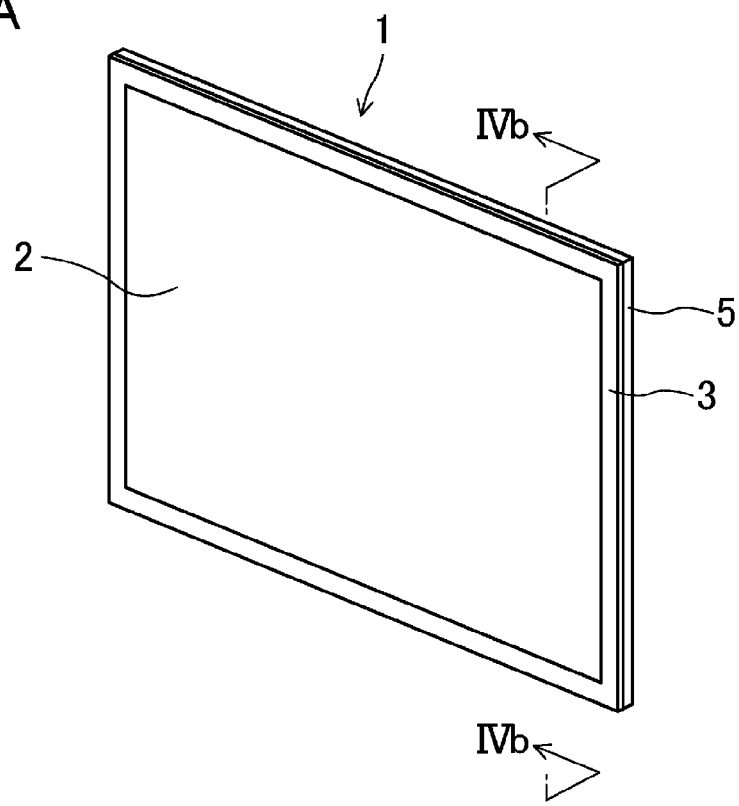
FIGS. 4A and 4B illustrate a display device of the embodiment.
Figure 4B:
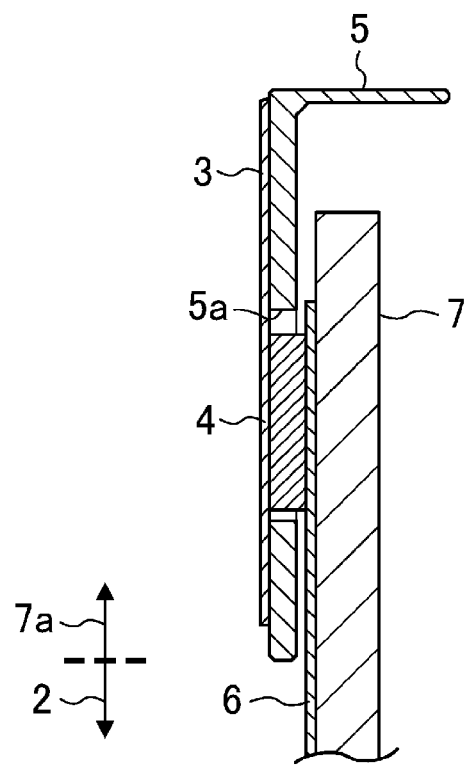

Referring now to FIGS. 4A and 4B, function and advantages of the display device 1 configured as described above will be described.

In the display device 1 of this embodiment, the conductive decorative panel 3 on the surface of the housing frame 5 is electrically connected to the conductive film 6 on the surface of the display panel 7 via the coupling members 4 provided in the through holes 5a of the housing frame 5. This configuration can reduce unwanted radiation from the conductive decorative panel 3.

In a conventional configuration, a conductive member different from the conductive film 6 is provided on the front surface of the conductive film 6. In the embodiment, based on the fact that the conductive film 6 itself has conductivity and the conductive film 6 has a reference potential, the conductive film 6 is electrically connected to the decorative panel 3. As a result, the number of components can be reduced with reduction of thickness of the display device 1, and furthermore, unwanted radiation can be successively reduced.

The conductive film 6 preferably has a small unevenness on its surface in terms of obtaining electrical connection to the coupling members 4. Thus, in this embodiment, the conductive film 6 has a mesh structure including a fibrous member having an unevenness on its surface, and thereby, obtains ground to the coupling members 4. The mesh pattern of the fibrous member in the conductive film 6 is merely an example. Thus, the conductive film 6 may be smooth on its surface as long as light transmittance and conductivity are obtained. In other words, a conductive fibrous member does not need to be disposed to have a mesh pattern.

The use of a clamp, e.g., a screw, as a coupling member as described in a conventional technique might cause the tip of, for example, the screw to damage the conductive film 6 and the display panel 7. On the other hand, in this embodiment, since an elastic member is selected as the coupling members 4, the conductive film 6 and the display panel 7 are not damaged.

The display device 1 is typically designed to have a long lifetime, and the clearance between the decorative panel 3 and the conductive film 6 is strictly designed. Thus, under some elastic properties of the coupling members 4, an error might occur in the clearance between the decorative panel 3 and the conductive film 6 over time. As described above, in this embodiment, a sponge member is selected among elastic materials. This selection allows only a small repulsing force of the coupling members 4 to be applied to the decorative panel 3 and the conductive film 6 upon deformation of the coupling members 4. Accordingly, the display device 1 of this embodiment is suitable for a long-term use.

The housing frame 5 preferably well holds the decorative panel 3 and is aesthetic when viewed sideways. In this embodiment, the housing frame 5 is made of aluminium having a non-conductive surface after a surface treatment. The decorative panel 3 is held by a double-sided adhesive tape attached to the surface of the housing frame 5. Then, an aesthetic appearance can be obtained when viewed sideways, and in addition, detachment of the decorative panel 3 can be reduced by a firm bonding between a rough mat-like surface of aluminium oxide after a surface oxidation and the double-sided adhesive tape. The surface oxidation for making the surface of the housing frame 5 non-conductive does not need to be performed on the entire surface of the housing frame 5.

The decorative panel 3 preferably has an aesthetic appearance and is lightweight in terms of prevention of detachment. In this embodiment, lightweight aluminium is used for the decorative panel 3, thereby obtaining both an aesthetic appearance that is unique to aluminium and uneasiness of detachment.

<Summary of Embodiment>

In this embodiment, since the conductive decorative panel 3 and the conductive film 6 are electrically connected to each other via the coupling members 4, unwanted radiation from the decorative panel 3 can be reduced. In this reduction, the conductive film 6 serving as an electromagnetic shield of the display panel 7 is used as a component for grounding, and thus, none of an unnecessary increase in the thickness of the housing and an increase in the number of components occur. In addition, the degree of freedom in internal design of the display device 1 does not decrease.

Industrial Applicability

A display device according to the present disclosure is useful as a television receiver, a digital photoframe, an information display, etc.

DESCRIPTION OF REFERENCE CHARACTERS 1 display device
2 display part
3 decorative panel
4 coupling member
5 housing frame
5a through hole
6 conductive film
7 display panel
7a peripheral part
8 back cover

The invention claimed is:

1. A display device, comprising:
a display panel including a display part;
a conductive film located on a front surface of the display panel, the conductive film being made of a conductive member;
a housing frame having a non-conductive portion that is located on a surface of the conductive film opposite to a surface of the conductive film facing the display panel, covers a peripheral part of the display panel, and has at least one through hole penetrating the housing frame along a front-and-back direction;
a coupling member disposed in the through hole, and electrically coupled to the conductive film, the coupling member being made of a conductive elastic member including a sponge member and a conductive member covering the sponge member; and
a conductive decorative panel that covers a surface of the housing frame opposite to a surface of the housing frame facing the conductive film and is electrically coupled to the coupling member.

2. The display device of claim 1, wherein the conductive film includes a transparent film and a conductive fibrous member located in the transparent film and having a mesh pattern.

3. The display device of claim 1, wherein the coupling member includes an elastic material.

4. The display device of claim 1, wherein the housing frame is made of aluminum having a non-conductive surface, and is attached to the conductive film.

5. The display device of claim 1, wherein the decorative panel is made of aluminum.

6. The display device of claim 1, wherein a potential of the conductive film is set at a reference potential in the display panel.

* * * * *